(12) United States Patent
Cheng et al.

(10) Patent No.: US 9,508,779 B2
(45) Date of Patent: Nov. 29, 2016

(54) ELECTROLUMINESCENCE DISPLAY DEVICE AND FABRICATION METHOD THEREOF

(71) Applicant: BOE TECHNOLOGY GROUP CO., LTD., Beijing (CN)

(72) Inventors: Hongfei Cheng, Beijing (CN); Yuxin Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/418,588

(22) PCT Filed: Jun. 26, 2014

(86) PCT No.: PCT/CN2014/080896
§ 371 (c)(1),
(2) Date: Jan. 30, 2015

(87) PCT Pub. No.: WO2015/039481
PCT Pub. Date: Mar. 26, 2015

(65) Prior Publication Data
US 2016/0035804 A1  Feb. 4, 2016

(30) Foreign Application Priority Data
Sep. 23, 2013 (CN) .......................... 2013 1 0436164

(51) Int. Cl.
*H01L 29/08* (2006.01)
*H01L 27/32* (2006.01)
(Continued)

(52) U.S. Cl.
CPC ....... *H01L 27/3248* (2013.01); *H01L 51/0024* (2013.01); *H01L 51/56* (2013.01)

(58) Field of Classification Search
CPC  H01L 51/0024; H01L 51/56; H01L 27/3248
USPC ............................................. 257/40; 438/99
See application file for complete search history.

(56) References Cited

U.S. PATENT DOCUMENTS 5,918,113 A * 6/1999 Higashi ................ H01L 21/563
                                                    257/E21.503
7,132,801 B2  11/2006 Park et al.
(Continued)

FOREIGN PATENT DOCUMENTS

CN           1638575 A     7/2005
CN         101106849 A     1/2008
(Continued)

OTHER PUBLICATIONS

Chinese Office Action of Chinese Application No. 201310436164.4, mailed May 6, 2015 with English translation.
(Continued)

*Primary Examiner* — Trung Q Dang
(74) *Attorney, Agent, or Firm* — Collard & Roe, P.C.

(57) ABSTRACT

Embodiments of the disclosure disclose an electroluminescence display device and a fabrication method thereof. The electroluminescence display device comprises an opposed substrate (20) and an array substrate (10). The array substrate (10) comprises: a first substrate (11), and a thin film transistor (12), a first protective layer (131) and a first connection electrode (141) sequentially disposed on the first substrate (11). The first connection electrode (141) is connected to a drain electrode of the thin film transistor (12). The opposed substrate (20) comprises: a second substrate (21), and a first electrode (24), an organic electroluminescence layer (25) and a second electrode (26) sequentially disposed on the second substrate (21). The second electrode (26) and the first connection electrode (141) are connected with each other by a conductive adhesive (40). Thereby, the reliability of the electrical connection between the thin film transistor and the second electrode is enhanced, a film-forming time in the fabrication process of the connection electrode is shortened, and etching difficulty of the connection electrode reduced, and thus the productivity is improved.

14 Claims, 3 Drawing Sheets

(51) Int. Cl.
*H01L 51/00* (2006.01)
*H01L 51/56* (2006.01)

(56) References Cited

U.S. PATENT DOCUMENTS

2002/0074503 A1* 6/2002 Watanabe ......... H01L 27/14676
250/370.08
2004/0227459 A1* 11/2004 Imura ................ H01L 27/3253
313/504

FOREIGN PATENT DOCUMENTS

| CN | 102160185 A | 8/2011 |
| CN | 103474578 A | 12/2013 |
| CN | 203456465 U | 2/2014 |
| JP | 2004327215 A | 11/2004 |
| JP | 2007264005 A * | 10/2007 |

OTHER PUBLICATIONS

Second Chinese Office Action of Chinese Application No. 201310436164.4, mailed Nov. 4, 2015 with English ranslation.
International Search Report and Written Opinion of the International Searching Authority with Notice of Transmittal of the International Search Report and Written Opinion of PCT/CN2014/080896 in Chinese, mailed Sep. 23, 2014.
Third Chinese Office Action of Chinese Application No. 201310436164A, mailed Mar. 23, 2016 with English translation.
English translation of the International Preliminary Report on Patentability and Written Opinion of the International Searching Authority of PCT/CN2014/080896, issued Mar. 29, 2016.

* cited by examiner

US 9,508,779 B2

ELECTROLUMINESCENCE DISPLAY DEVICE AND FABRICATION METHOD THEREOF

CROSS REFERENCE TO RELATED APPLICATIONS

This application is the National Stage of PCT/CN2014/080896 filed on Jun. 26, 2014, which claims priority under 35 U.S.C. §119 of Chinese Application No. 201310436164.4 filed on Sep. 23, 2013, the disclosure of which is incorporated by reference.

TECHNICAL FIELD

Embodiments of the disclosure relate to an electroluminescence display device and a fabrication method thereof.

BACKGROUND

Organic Light Emitting Diode (OLED) display device, also known as an organic electroluminescence display device, has recently been widely used in mobile communication terminals, personal digital assistants (PDAs), pocket personal computers, etc., due to its outstanding advantages such as self-luminescence, no need of backlight, high contrast, small thickness, wide viewing angle, quick response, suitable for wide temperature range, simple structure and simple fabrication process.

OLED display devices are divided into a passive matrix type and an active matrix type. In the OLED display device of active matrix type, current flowing through each OLED is controlled by a Thin Film Transistor (TFT) circuit, and high luminescence efficiency and good image display effect can be achieved.

As shown in FIG. 1, the OLED display device of active-matrix type comprises an array substrate 110 and a color filter substrate 120. The array substrate 110 comprises: a first substrate 111, and an array of thin film transistors 112, a protective layer 113 and a connection electrode 114 sequentially disposed on the first substrate 111. The connection electrode 114 is connected to a drain electrode of the thin film transistor 112 through a via hole formed in the protective layer 113. The color filter substrate 120 comprises: a second substrate 121, and a color filter layer, a planarization layer 123, a first electrode 124, an organic electroluminescence layer (an organic EL layer) 125 and a second electrode 126 sequentially disposed on the second substrate 121. The color filter layer comprises: black matrixes 1221, and color filters 1222 separated by the black matrixes 1221. After the color filter substrate 120 and the array substrate 110 are bonded with each other, the second electrode 126 on the color filter substrate is in contact with the connection electrode 114 on the array substrate 110 so as to implement an electrical connection between the thin film transistor 112 and the second electrode 126.

In order that the connection electrode 114 and the second electrode 126 are in the stable contact to enhance reliability of the electrical connection between the thin film transistor 112 and the second electrode 126, the connection electrode 114 is generally formed to be relatively thick (typically 2-3 microns thick). Further, if there are impurities adhering on contact surfaces of the connection electrode 114 and/or the second electrode 126, a poor contact may be caused.

SUMMARY

According to the embodiments of the disclosure, an electroluminescence display device is provided. The electroluminescence display device comprises: an opposed substrate and an array substrate. The array substrate comprises: a first substrate, and a thin film transistor, a first protective layer and a first connection electrode sequentially disposed on the first substrate, the first connection electrode is connected to a drain electrode of the thin film transistor. The opposed substrate comprises: a second substrate, and a first electrode, an organic electroluminescence layer and a second electrode sequentially disposed on the second substrate. The second electrode and the first connection electrode are connected with each other by a conductive adhesive.

For example, the conductive adhesive is disposed between the second electrode and the first connection electrode.

For example, the conductive adhesive is only disposed on a contact surface of the second electrode and the first connection electrode, so that the conductive adhesive is disposed in a discontinuous manner.

For example, the conductive adhesive is disposed in a continuous manner.

For example, the first protective layer protrudes along a direction away from the first substrate to form a first protrusion, and the first connection electrode is disposed on the first protrusion.

For example, the opposed substrate further comprises a second protective layer and a second connection electrode; the second protective layer covers the second electrode and the organic electroluminescence layer below the second electrode, and the second protective layer is provided with a via hole; the second connection electrode is disposed on the second protective layer and is connected to the second electrode through the via hole; and the conductive adhesive is disposed between the second connection electrode and the first connection electrode.

For example, the second protective layer protrudes along a direction away from the second substrate to form a second protrusion, and the second connection electrode is disposed on the second protrusion.

For example, the opposed substrate and the array substrate are bonded with each other by a sealant at the edges of the opposed and array substrates; and the conductive adhesive is filled in a space surrounded by the opposed substrate, the array substrate and the sealant.

For example, the conductive adhesive comprises: a matrix resin and conductive particles dispersed within the matrix resin; and the matrix resin comprises epoxy resin, acrylate resin or polychloroester.

For example, the first protective layer is made of silicon nitride, silicon oxide, photosensitive resin or combinations thereof.

For example, the second protective layer is made of silicon nitride, silicon oxide, photosensitive resin or combinations thereof.

According to the embodiments of the disclosure, a fabrication method of an electroluminescence display device is provided. The electroluminescence display device comprises an array substrate and an opposed substrate. The array substrate comprises: a first substrate, and a thin film transistor, a first protective layer and a first connection electrode sequentially disposed on the first substrate; the first connection electrode is connected to a drain electrode of the thin film transistor. The opposed substrate comprises: a second substrate, and a first electrode, an organic electroluminescence layer and a second electrode sequentially disposed on the second substrate. The method comprises: a fabrication process of the opposed substrate, a fabrication process of the array substrate, and a fabrication process of bonding the opposed substrate and the array substrate. The fabrication process of bonding the opposed substrate and the array substrate comprises: step 1: coating a conductive adhesive on a bonding surface of the opposed substrate and/or a bonding surface of the array substrate; and step 2: bonding the opposed substrate and the array substrate, and meanwhile heating and pressurizing the conductive adhesive so that the second electrode and the first connection electrode are connected with each other by the conductive adhesive.

For example, in step 1, the conductive adhesive is only coated on a top surface of the second electrode on the opposed substrate and/or a top surface of the first connection electrode on the array substrate.

For example, in step 1, the conductive adhesive is coated on the entire bonding surface of the opposed substrate and/or the entire bonding surface of the array substrate.

For example, prior to the step 1 or prior to the step 2, the fabrication process of bonding the opposed substrate and the array substrate further comprises: coating a sealant on the bonding surface of the opposed substrate and/or the bonding surface of the array substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DESCRIPTION OF THE EMBODIMENTS

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

It should be noted that, in the specification and claims, words such as "first", "second" and the like do not denote any order, quantity, or importance, but rather are used to distinguish different components.

Figure 1:
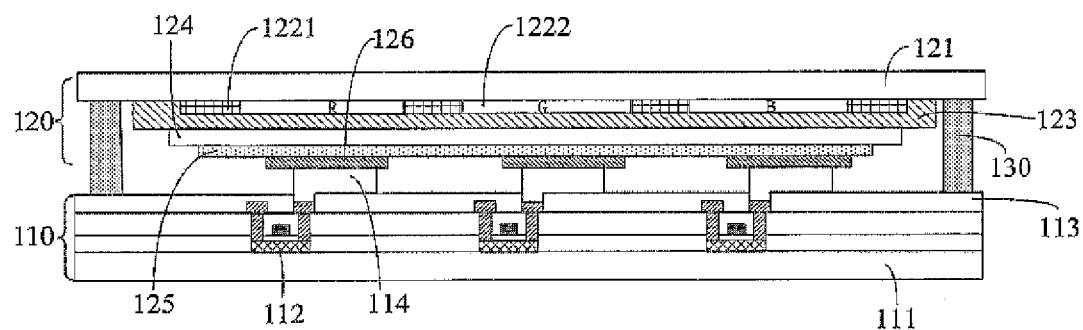
FIG. 1 is a structural schematic view illustrating an OLED display device of active matrix type according to one technique.
Figure 2:
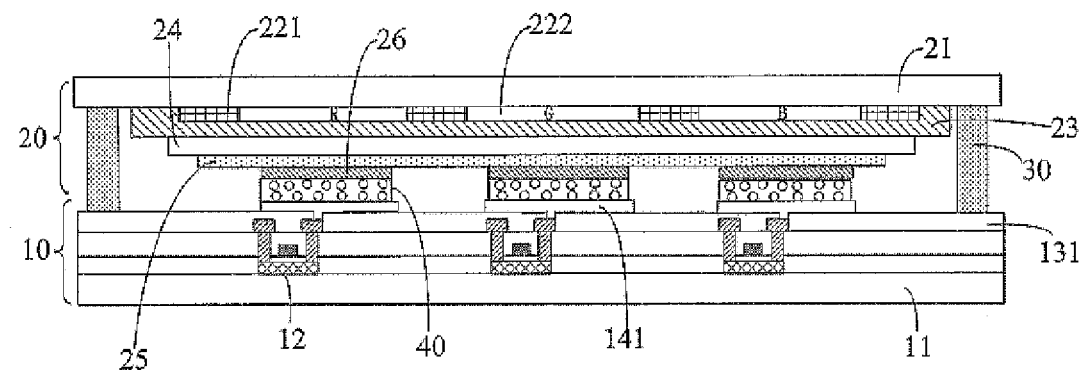
FIG. 2 is a structural schematic view illustrating an electroluminescence display device according to embodiments of the disclosure.

Embodiments of the disclosure provide an electroluminescence display device. With reference to FIG. 2, the electroluminescence display device comprises: an array substrate 10 and an opposed substrate 20. The array substrate 10 comprises: a first substrate 11, and a thin film transistor 12, a first protective layer 131 and a first connection electrode 141 sequentially disposed on the first substrate 11. The first connection electrode 141 is connected to a drain electrode of the thin film transistor. For example, the opposed substrate 20 is a color filter substrate, and comprises: a second substrate 21, and a color filter layer, a planarization layer 23, a first electrode 24, an organic electroluminescence layer 25 and a second electrode 26 sequentially disposed on the second substrate 21. The color filter layer comprises: black matrixes (BM) 221, and color filters 222 (e.g., red, green and blue (R/G/B) color filters as shown in the drawings) which are separated by the black matrixes 221. The second electrode 26 and the first connection electrode 141 are connected with each other by a conductive adhesive 40.

In general, the active electroluminescence display device comprises the opposed substrate 20 and the array substrate 10; the opposed substrate 20 is provided with the color filter layer and the OLED serving as luminescence element, and the OLED comprises the first electrode 24, the organic electroluminescence layer 25 and the second electrode 26; the array substrate 10 is provided with a TFT circuit (e.g. a driving circuit) configured for driving the OLED and implementing a compensation effect on the OLED. There are a plurality of modes for implementing the driving circuit, and the driving circuit at least comprises one thin film transistor serving as driving thin film transistor. The thin film transistor 12 in this embodiment just is the driving thin film transistor in the driving circuit. The drain electrode of the thin film transistor 12 is connected with the first connection electrode 141; and after the opposed substrate 20 and the array substrate 10 are bonded with each other, the second electrode 26 of the OLED and the first connection electrode 141 on the array substrate 10 are connected with each other so that the driving circuit and the luminescence element are electrically connected with each other.

In the electroluminescence display device according to the embodiments of the disclosure, during the process of bonding the opposed substrate and the array substrate with each other, the conductive adhesive is coated on a bonding surface of the opposed substrate and/or a bonding surface of the array substrate, and the conductive adhesive is heated and pressurized so that the second electrode and the first connection electrode are connected with each other by the conductive adhesive. A conductive substance in the conductive adhesive electrically connects the second electrode and first connection electrode, and the OLED serving as luminescence element and the thin film transistor are connected with each other more reliably. Due to the conductive adhesive, the connection between the second electrode and the first connection electrode is sufficiently reliable, so that a thickness of the first connection electrode can be reduced (for example, to 0.3~4 micron); and in this case, a film-forming time in the fabrication process of the first connection electrode can be shortened, the etching difficulty of the first connection electrode can be reduced, and the productivity can be improved. In addition, the conductive adhesive further has a buffering effect so that defects caused by frictions or pressures between the opposed substrate and the array substrate can be reduced and thus the yield can be improved.

Figure 3:
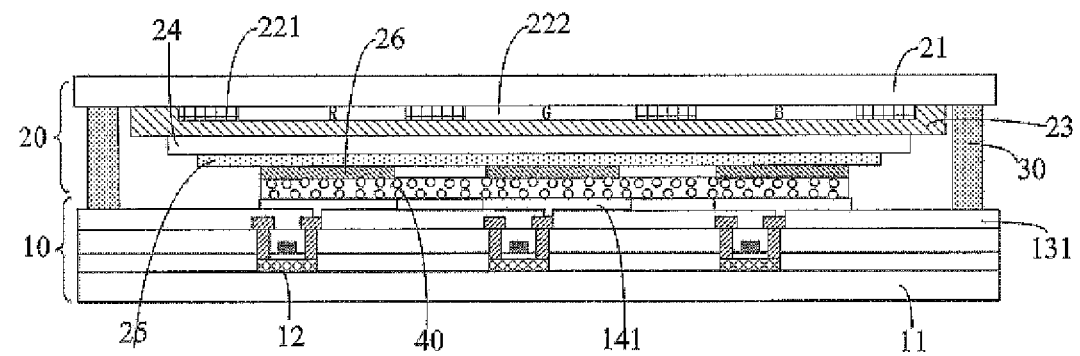
FIG. 3 is a structural schematic view illustrating an electroluminescence display device according to the embodiments of the disclosure.

As shown in FIG. 2 and FIG. 3, in a first example according to the embodiments of the disclosure, the conductive adhesive 40 is disposed between the second electrode 26 and the first connection electrode 141. For example, the conductive adhesive 40 is disposed in a discontinuous manner as shown in FIG. 2; and in this case, the conductive adhesive 40 is only disposed on a contact surface of the second electrode 26 and the first connection electrode 141. For example, the conductive adhesive 40 is disposed in a continuous manner, as shown in FIG. 3.

Figure 4:
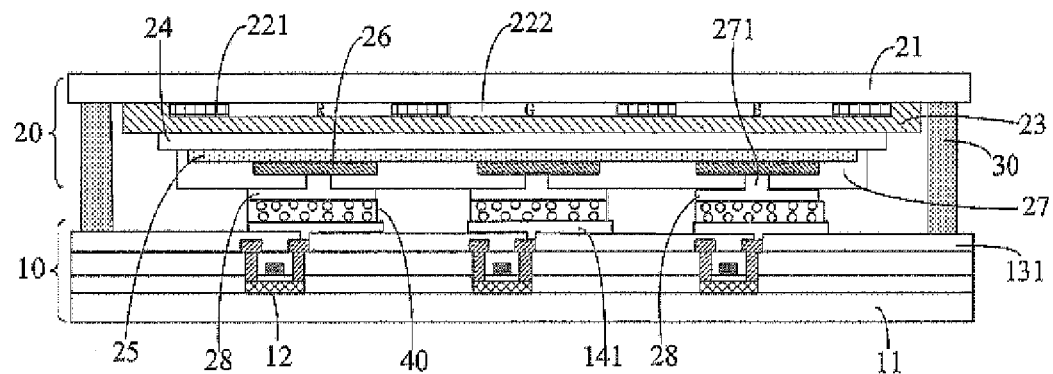
FIG. 4 is a structural schematic view illustrating an electroluminescence display device according to the embodiments of the disclosure.
Figure 5:
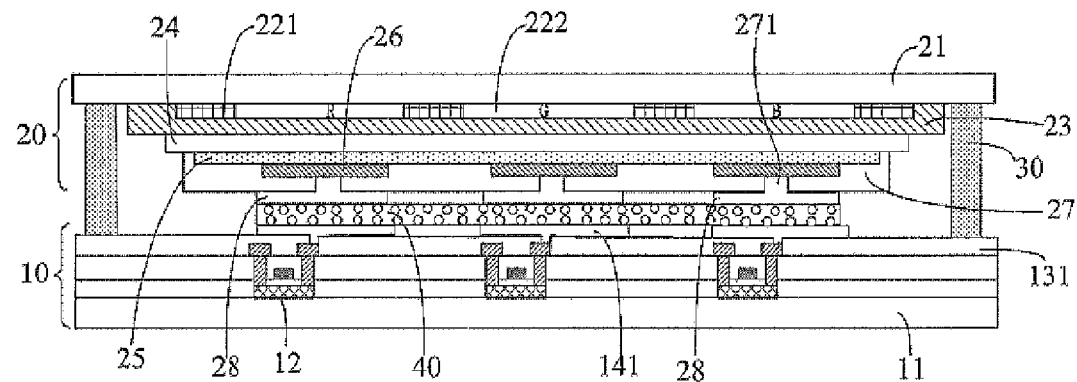
FIG. 5 is a structural schematic view illustrating an electroluminescence display device according to the embodiments of the disclosure.

As shown in FIG. 4 and FIG. 5, in a second example according to the embodiments of the disclosure, the opposed substrate 20 further comprises a second protective layer 27 and a second connection electrode 28; the second protective layer 27 covers the second electrode 26 and the organic electroluminescence layer 25 below the second electrode 26, and the second protective layer 27 is provided with a via hole 271; the second connection electrode 28 is disposed on the second protective layer 27 and is connected to the second electrode 26 through the via hole 271. The conductive adhesive 40 is disposed between the second connection electrode 28 and the first connection electrode 141. For example, the conductive adhesive 40 is disposed in a discontinuous manner as shown in FIG. 4; and in this case, the conductive adhesive 40 is only disposed on a contact surface of the second connection electrode 28 and the first connection electrode 141. For example, the conductive adhesive 40 is disposed in a continuous manner, as shown in FIG. 5.

By providing the second protective layer 27, a buffering effect can be exerted during the process of bonding the opposed substrate with the array substrate to prevent the organic electroluminescence layer 25 from suffering an excessive stress, so that the organic electroluminescence layer 25 can be protected. Meanwhile, by providing the second protective layer 27a, the thickness of the connection electrode (in this example, the connection electrode comprises the first connection electrode 141 and the second connection electrode 28) can be reduced.

Figure 6:
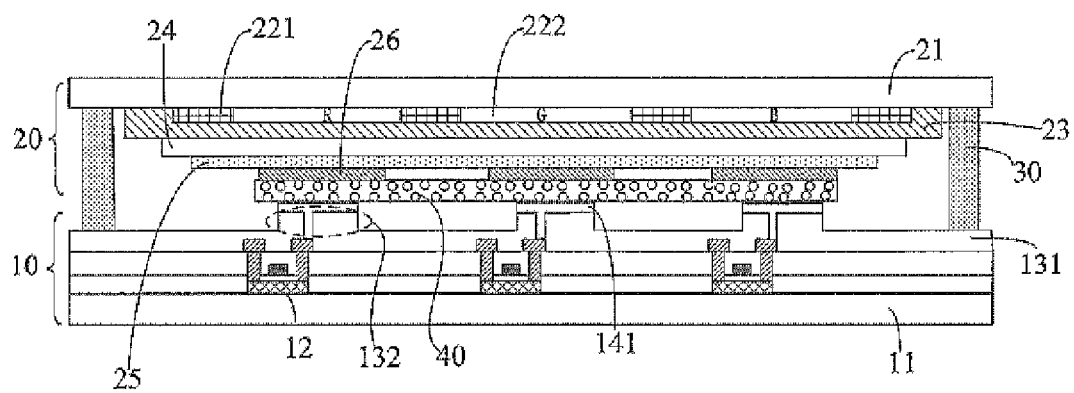
FIG. 6 is a structural schematic view illustrating an electroluminescence display device according to the embodiments of the disclosure.
Figure 7:
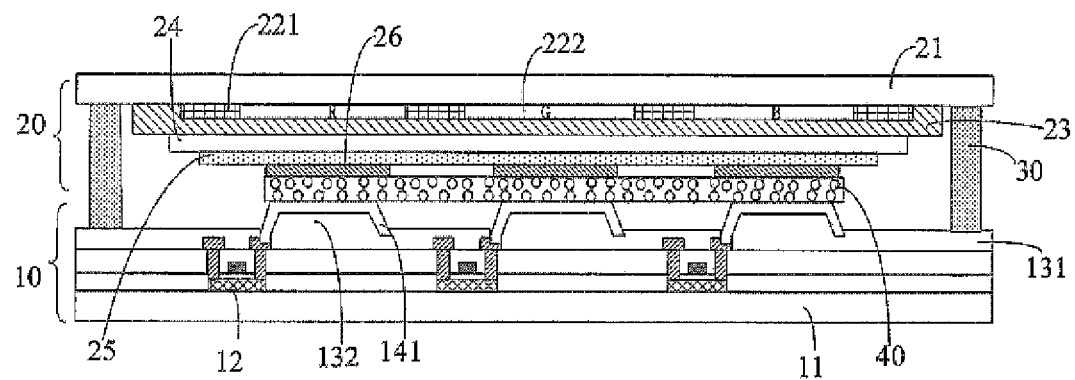
FIG. 7 is a structural schematic view illustrating an electroluminescence display device according to the embodiments of the disclosure.

As shown in FIG. 6 and FIG. 7, in a third example according to the embodiments of the disclosure, the first protective layer 13 below the first connection electrode 141 on the array substrate 10 protrudes along a direction away from the first substrate 11, so as to form a first protrusion 132.

In order to further reduce the thickness of the connection electrode, the first protrusion 132 is provided on the first protective layer 13 of the array substrate 10, and the first connection electrode 141 is provided on the first protrusion 132. The conductive adhesive is provided between the second electrode 26 and the first connection electrode 141. For example, as shown in FIG. 6, the first protrusion 132 is provided just above the drain electrode of the thin film transistor 12, the first connection electrode 141 is disposed on the first protrusion 132 and is connected to the drain electrode of the thin film transistor 12 through a via hole which is provided in the first protective layer 13 and provided at the first protrusion 132. For example, as shown in FIG. 7, the first protrusion 132 is provided above the thin film transistor 12 but staggered from the drain electrode of the thin film transistor 12; the via hole in the first protective layer 13 is provided close to the first protrusion 132; and the first connection electrode 141 covers the first protrusion 132 and the via hole in the first protective layer 13, so that the first connection electrode 141 is connected to the drain electrode of the thin film transistor 12.

It should be noted that, in the embodiments of the disclosure, the second connection electrode 28 may be jacked up by providing a protrusion on the opposed substrate 20. More specifically, as shown in FIG. 9, the second protective layer 27 below the second connection electrode protrudes along a direction away from the second substrate 21 to form a second protrusion 272.

The first protective layer 131 and/or the second protective layer 27 are configured to have protrusions so as to jack up the connection electrodes. On the one hand, the connection between the first and second connection electrodes becomes more reliable, the thicknesses of the first and second connection electrodes can be reduced (for example, to 0.3~1 micron), the film-forming time in the fabrication process of the first and second connection electrodes can be shortened, and the etching difficulty of the first and second connection electrodes can be reduced. On the other hand, the defects caused by frictions or pressures between the opposed substrate and the array substrate can be reduced and thus the yield can be improved.

Figure 8:
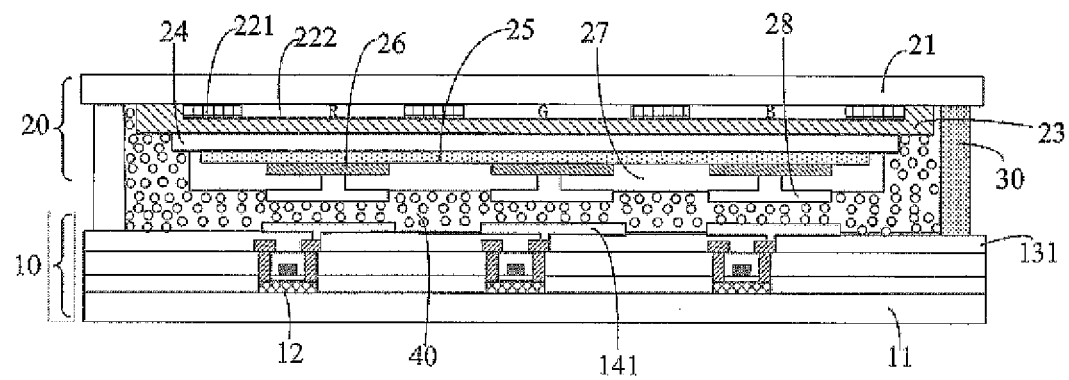
FIG. 8 is a structural schematic view illustrating an electroluminescence display device according to the embodiments of the disclosure.
Figure 9:
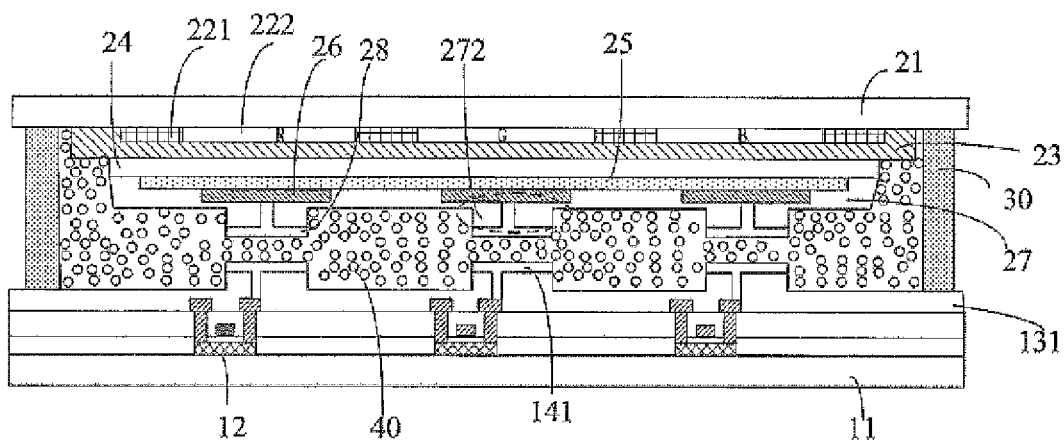
FIG. 9 is a structural schematic view illustrating an electroluminescence display device according to the embodiments of the disclosure.

In a fourth example according to the embodiments of the disclosure, the opposed substrate 20 and the array substrate 10 are bonded with each other by a sealant 30 at the edges of the substrates, and the conductive adhesive 40 is filled in a space surrounded by the opposed substrate 20, the array substrate 10 and the sealant 30, as shown in FIG. 8 and FIG. 9. In FIG. 8, both the first protective layer 131 and the second protective layer 27 are not provided with the protrusion; in FIG. 9, both the first protective layer 131 and the second protective layer 27 are provided with the protrusion.

The conductive adhesive 40 according to the embodiments of the disclosure is an adhesive having certain conductive properties after being cured or dried. For example, the conductive adhesive 40 comprises: a matrix resin and conductive particles dispersed within the matrix resin. The conductive adhesive 40 binds the conductive particles together by the bonding effect of the matrix resin to form a conductive path, so that the electrical connection between the thin film transistor and the OLED is achieved. For example, the matrix resin comprises, but not limited to, epoxy resin, acrylate resin or polychloroester.

The first protective layer and/or the second protective layer according to the embodiments of the disclosure are/is made of silicon nitride, silicon oxide, photosensitive resin or combinations thereof.

In the electroluminescence display device according to the embodiments of the disclosure, the conductive adhesive achieves a more reliable connection between the luminescence element OLED and the thin film transistor, so poor contact will not be caused even if there are impurities adhering on the contact surface of the electrodes (e.g. the second electrode and the first connection electrode). In addition, the thicknesses of the connection electrodes can be reduced, the defects caused by frictions or pressures between the opposed substrate and the array substrate can be reduced and thus the yield can be improved.

The electroluminescence display device according to the embodiments of the disclosure may be: an e-paper, a mobile phone, a tablet personal computer, a television, a monitor, a laptop computer, a digital photo frame, a navigator, and any other products or components having a display function.

Embodiments of the disclosure further provide a fabrication method of the electroluminescence display device. The method comprises: a fabrication process of the opposed substrate, a fabrication process of the array substrate, and a fabrication process of bonding the opposed substrate and the array substrate. The fabrication process of bonding the opposed substrate and the array substrate comprises:

Step 101: coating the conductive adhesive on the bonding surface of the opposed substrate and/or the bonding surface of the array substrate;

Step 102: bonding the opposed substrate and the array substrate, and meanwhile heating and pressurizing the conductive adhesive so that the second electrode and the first connection electrode are connected with each other by the conductive adhesive.

In step 101, the conductive adhesive may be only coated on a top surface of the second electrode on the opposed substrate and/or a top surface of the first connection electrode on the array substrate so as to save material. In addition, the conductive adhesive may be coated on the entire bonding surface of the opposed substrate and/or the entire bonding surface of the array substrate; and in this case, the process is relatively simple and the opposed substrate and the array substrate are bonded more firmly. For example, prior to step 101 or prior to step 102, the fabrication process of bonding the opposed substrate and the array substrate further comprises: coating the sealant on the bonding surface of the opposed substrate and/or the bonding surface of the array substrate.

For the fabrication process of the opposed substrate and the fabrication process of the array substrate according to the embodiments of the disclosure, conventional techniques may be used, which will not be repeated here.

In the fabrication method of the electroluminescence display device according to the embodiments of the disclosure, the conductive adhesive comprising conductive particles is disposed on the bonding surface of the opposed substrate and/or the bonding surface of the array substrate, and the conductive adhesive is heated and pressurized during the process of bonding the opposed substrate and the array substrate, so that the luminescence element OLED and the thin film transistor are connected more reliably. In addition, due to the conductive adhesive, the thicknesses of the connection electrodes can be reduced, the defects caused by frictions or pressures between the opposed substrate and the array substrate can be reduced and thus the yield can be improved.

It should be noted that, in the above description, the color filter layer is formed on the opposed substrate 20; however, the embodiments of the disclosure are not limited thereto, and the color filter layer may be formed on the array substrate 10.

Various embodiments in the present specification are described in a progressive manner, for the identical or similar parts among respective embodiments, the embodiments may be referred to mutually, and each embodiment emphasizes differences from the other embodiments. Particularly, for a method embodiment, since it is substantially similar to a product embodiment, the description thereof is relatively simple, and for the relevant part, the illustration of the product embodiment may be referred to.

It should be noted that, various technical features in the embodiments of the disclosure may be arbitrarily combined in a case of no conflict.

The foregoing embodiments merely are exemplary embodiments of the disclosure, and not intended to define the scope of the disclosure, and the scope of the disclosure is determined by the appended claims.

The present application claims priority of Chinese Patent Application No. 201310436164.4 filed on Sep. 23, 2013, and the above Chinese patent application is incorporated herein by reference in its entirety as part of the present application.

What is claimed is:

1. An electroluminescence display device, comprising: an opposed substrate and an array substrate, wherein
   the array substrate comprises: a first substrate, and a thin film transistor, a first protective layer and a first connection electrode sequentially disposed on the first substrate, the first connection electrode is connected to a drain electrode of the thin film transistor;
   the opposed substrate comprises: a second substrate, and a first electrode, an organic electroluminescence layer and a second electrode sequentially disposed on the second substrate;
   the second electrode and the first connection electrode are connected with each other by a conductive adhesive;
   the opposed substrate further comprises a second protective layer and a second connection electrode;
   the second protective layer covers the second electrode and the organic electroluminescence layer below the second electrode, and the second protective layer is provided with a via hole;
   the second connection electrode is disposed on the second protective layer and is connected to the second electrode through the via hole; and
   the conductive adhesive is disposed between the second connection electrode and the first connection electrode.

2. The device according to claim 1, wherein the conductive adhesive is disposed between the second electrode and the first connection electrode.

3. The device according to claim 2, wherein the conductive adhesive is only disposed on a contact surface of the second electrode and the first connection electrode, so that the conductive adhesive is disposed in a discontinuous manner.

4. The device according to claim 2, wherein the conductive adhesive is disposed in a continuous manner.

5. The device according to claim 1, wherein the first protective layer protrudes along a direction away from the first substrate to form a first protrusion, and the first connection electrode is disposed on the first protrusion.

6. The device according to claim 1, wherein the second protective layer protrudes along a direction away from the second substrate to form a second protrusion, and the second connection electrode is disposed on the second protrusion.

7. The device according to claim 1, wherein the opposed substrate and the array substrate are bonded with each other by a sealant at the edges of the opposed and array substrates; and
   the conductive adhesive is filled in a space surrounded by the opposed substrate, the array substrate and the sealant.

8. The device according to claim 1, wherein the conductive adhesive comprises: a matrix resin and conductive particles dispersed within the matrix resin; and
   the matrix resin comprises epoxy resin, acrylate resin or polychloroester.

9. The device according to claim 1, wherein the first protective layer is made of silicon nitride, silicon oxide, photosensitive resin or combinations thereof.

10. The device according to claim 1, wherein the second protective layer is made of silicon nitride, silicon oxide, photosensitive resin or combinations thereof.

11. A fabrication method of an electroluminescence display device, the electroluminescence display device comprising an array substrate and an opposed substrate; the array substrate comprising: a first substrate, and a thin film transistor, a first protective layer and a first connection electrode sequentially disposed on the first substrate; the first connection electrode being connected to a drain electrode of the thin film transistor; the opposed substrate comprising: a second substrate, and a first electrode, an organic electroluminescence layer and a second electrode sequentially disposed on the second substrate; the opposed substrate further comprising a second protective layer and a second connection electrode, the second protective layer covering the second electrode and the organic electroluminescence layer below the second electrode and the second protective layer being provided with a via hole, the second connection electrode being disposed on the second protective layer and being connected to the second electrode through the via hole; and the method comprising: a fabrication process of the opposed substrate, a fabrication process of the array substrate, and a fabrication process of bonding the opposed substrate and the array substrate, wherein the fabrication process of bonding the opposed substrate and the array substrate comprises:

step 1: coating a conductive adhesive on a bonding surface of the opposed substrate and/or a bonding surface of the array substrate; and step 2: bonding the opposed substrate and the array substrate, and meanwhile heating and pressurizing the conductive adhesive so that the second electrode and the first connection electrode are connected with each other by the conductive adhesive, and wherein the conductive adhesive is disposed between the second connection electrode and the first connection electrode.

12. The fabrication method according to claim 11, wherein in step 1, the conductive adhesive is only coated on a top surface of the second connection electrode on the opposed substrate and/or a top surface of the first connection electrode on the array substrate.

13. The fabrication method according to claim 11, wherein in step 1, the conductive adhesive is coated on the entire bonding surface of the opposed substrate and/or the entire bonding surface of the array substrate.

14. The fabrication method according to claim 11, wherein prior to the step 1 or prior to the step 2, the fabrication process of bonding the opposed substrate and the array substrate further comprises: coating a sealant on the bonding surface of the opposed substrate and/or the bonding surface of the array substrate.

* * * * *